(12) United States Patent
Stoek et al.

(10) Patent No.: US 11,769,748 B2
(45) Date of Patent: Sep. 26, 2023

(54) SEMICONDUCTOR DEVICE HAVING A METAL CLIP WITH A SOLDER VOLUME BALANCING RESERVOIR

(71) Applicant: Infineon Technologies AG, Neubiberg (DE)

(72) Inventors: Thomas Stoek, Buxtehude (DE); Michael Stadler, Munich (DE); Mohd Hasrul Zulkifli, Selangor (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/073,090

(22) Filed: Dec. 1, 2022

(65) Prior Publication Data
US 2023/0094794 A1   Mar. 30, 2023

Related U.S. Application Data

(62) Division of application No. 17/155,241, filed on Jan. 22, 2021, now Pat. No. 11,545,459.

(51) Int. Cl.
*H01L 23/00*   (2006.01)
*H01L 23/495*   (2006.01)

(52) U.S. Cl.
CPC ........ *H01L 24/37* (2013.01); *H01L 23/49524* (2013.01); *H01L 24/84* (2013.01); *H01L 2224/37005* (2013.01); *H01L 2224/84815* (2013.01)

(58) Field of Classification Search
CPC .............. H01L 24/36–41; H01L 24/84; H01L 2224/37005–37012; H01L 2224/84815
See application file for complete search history.

(56) References Cited

U.S. PATENT DOCUMENTS

| | | |
|---|---|---|
| 8,067,273 B2 | 11/2011 | Gomez |
| 8,354,733 B2 | 1/2013 | Chang |
| 8,354,740 B2 | 1/2013 | LIU et al. |
| 8,564,110 B2 | 10/2013 | Xue et al. |
| 9,418,918 B2 | 8/2016 | Groenhuis et al. |
| 2015/0270207 A1 | 9/2015 | Kim et al. |
| 2018/0350726 A1* | 12/2018 | Mangrum ......... H01L 23/49575 |

* cited by examiner

*Primary Examiner* — Tucker J Wright
(74) *Attorney, Agent, or Firm* — Murphy, Bilak & Homiller, PLLC

(57) ABSTRACT

A semiconductor device includes a semiconductor die attached to a substrate and a metal clip attached to a side of the semiconductor die facing away from the substrate by a soldered joint. The metal clip has a plurality of slots dimensioned so as to take up at least 10% of a solder paste that reflowed to form the soldered joint. Corresponding methods of production are also described.

20 Claims, 12 Drawing Sheets

SEMICONDUCTOR DEVICE HAVING A METAL CLIP WITH A SOLDER VOLUME BALANCING RESERVOIR

BACKGROUND

Metal clips are widely used as one means for contacting semiconductor dies (chips). Metal clips provide improved thermal management, device performance and faster switching times in power devices. For example, metal clips are typically used in Metal Oxide Semiconductor Field Effect Transistors (MOSFETs) and Isolated Gate Bipolar Transistors (IGBTs) to create a direct electrical and heat path from the drain and source sides of a vertical MOSFET die structure to improve switching times and heat management.

Metal clips are attached to a semiconductor die by dispensing solder to both a substrate and the die surface. Solder is first dispensed on top of the die pad of the substrate where the die backside is to be attached. Solder also is dispensed on the front side of the die which is then be attached to a metal clip. However, the metal clip attach process suffers from voiding caused by solder volume shrinkage during the solder reflow process. Flux content of solder paste is typically about 50% of the total solder paste volume. The flux evaporates during solder reflow and results in outgassing. Without enough solder paste volume, the outgassing causes voids in the soldered joint which can degrade thermal and electrical performance of the device and lead to reliability problems.

Thus, there is a need for an improved metal clip design that accommodates more solder paste and related clip-to-chip soldering processes.

SUMMARY

According to an embodiment of a method of clip soldering, the method comprises: applying solder paste to a first side of a first semiconductor die; placing a first metal clip over the first side of the first semiconductor die with the solder paste, the first metal clip having a plurality of slots dimensioned so as to take up at least 10% of the solder paste when the first metal clip is pressed toward the first semiconductor die; pressing the first metal clip toward the first semiconductor die, wherein at least 10% of the solder paste is forced into the slots by the pressing; and reflowing the solder paste to form a soldered joint between the first metal clip and the first semiconductor die, wherein the solder paste at least partly retracts from the slots during the reflowing to form part of the soldered joint.

According to an embodiment of a method of batch producing semiconductor devices, the method comprises: placing a plurality of semiconductor dies on a leadframe structure; applying solder paste to a side of each semiconductor die facing away from the leadframe structure; vertically aligning a metal clip structure with each adjacent pair of the semiconductor dies, each metal clip structure comprising a first metal clip integrally joined to a second metal clip by a bridging section, each metal clip having a plurality of slots dimensioned so as to take up at least 10% of the solder paste when the metal clip is pressed toward the semiconductor die vertically aligned with the metal clip; pressing each metal clip structure toward the pair of semiconductor dies vertically aligned with the metal clip structure and until the bridging section of each metal clip structure contacts a hard stop of the leadframe structure, wherein at least 10% of the solder paste is forced into the slots of the metal clips of each clip structure by the pressing; reflowing the solder paste to form a soldered joint between each metal clip and the semiconductor die vertically aligned with the metal clip, wherein the solder paste at least partly retracts from the slots of the metal clips during the reflowing to form part of the soldered joints; and severing connections to the leadframe structure and between the metal clips of each metal clip structure at the bridging section, to form individual semiconductor devices.

According to an embodiment of a semiconductor device, the semiconductor device comprises: a semiconductor die attached to a substrate; and a metal clip attached to a side of the semiconductor die facing away from the substrate by a soldered joint, wherein the metal clip has a plurality of slots dimensioned so as to take up at least 10% of a solder paste reflowed to form the soldered joint.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide an improved metal clip design with reservoirs for accommodating solder paste during soldering of the metal clip to a semiconductor die (chip). Related clip-to-chip soldering processes are also described. The metal clip described herein has a plurality of slots that function as solder paste reservoirs during the soldering process. That is, the slots formed in the metal clip are dimensioned so as to take up at least 10% of the solder paste when the metal clip is pressed toward the semiconductor die to which the clip is to be attached. During the clip pressing, at least 10% of the solder paste applied to the joining surface of the semiconductor die is forced into the slots of the metal clip by the pressing. As the solder paste reflows to form a soldered joint between the metal clip and the semiconductor die, the solder paste at least partly retracts from the slots to form part of the soldered joint. By accommodating at least 10% of the solder paste volume in the clip slots during the clip attach process, fewer voids result in the soldered joint formed between the metal clip and the semiconductor die because more solder paste may be used during the joining process.

Described next, with reference to the figures, are exemplary embodiments of the metal clip and related clip-to-chip soldering processes.

Figure 1A:
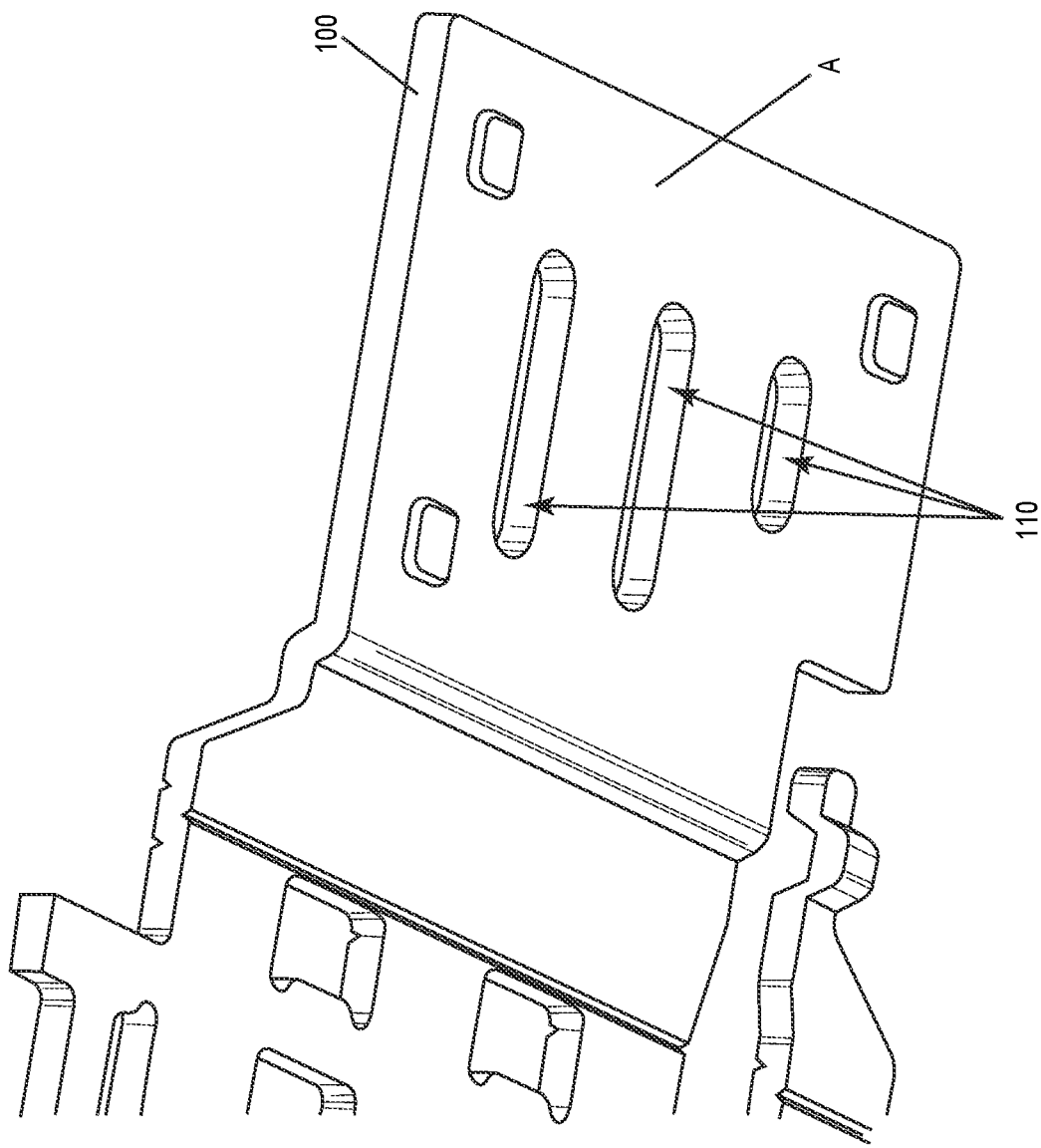
FIG. 1A illustrates a bottom perspective view of a metal clip designed for attachment to a semiconductor die and having reservoirs for holding solder paste during solder reflow.
Figure 1B:
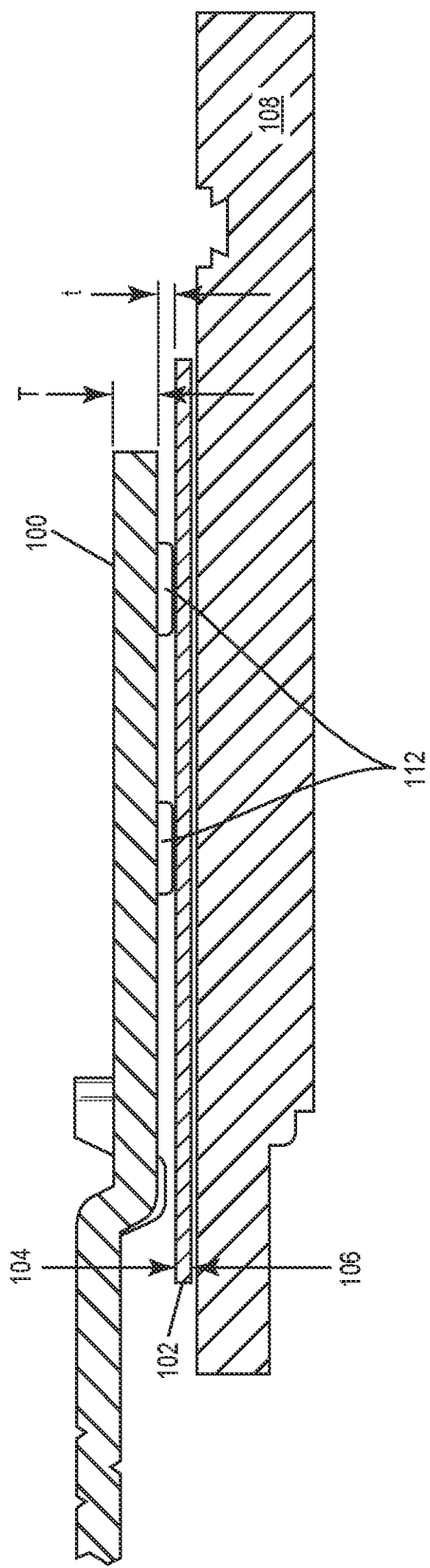
FIG. 1B illustrates a cross-sectional perspective view of the metal clip in FIG. 1A vertically aligned with a semiconductor die.
Figure 1C:
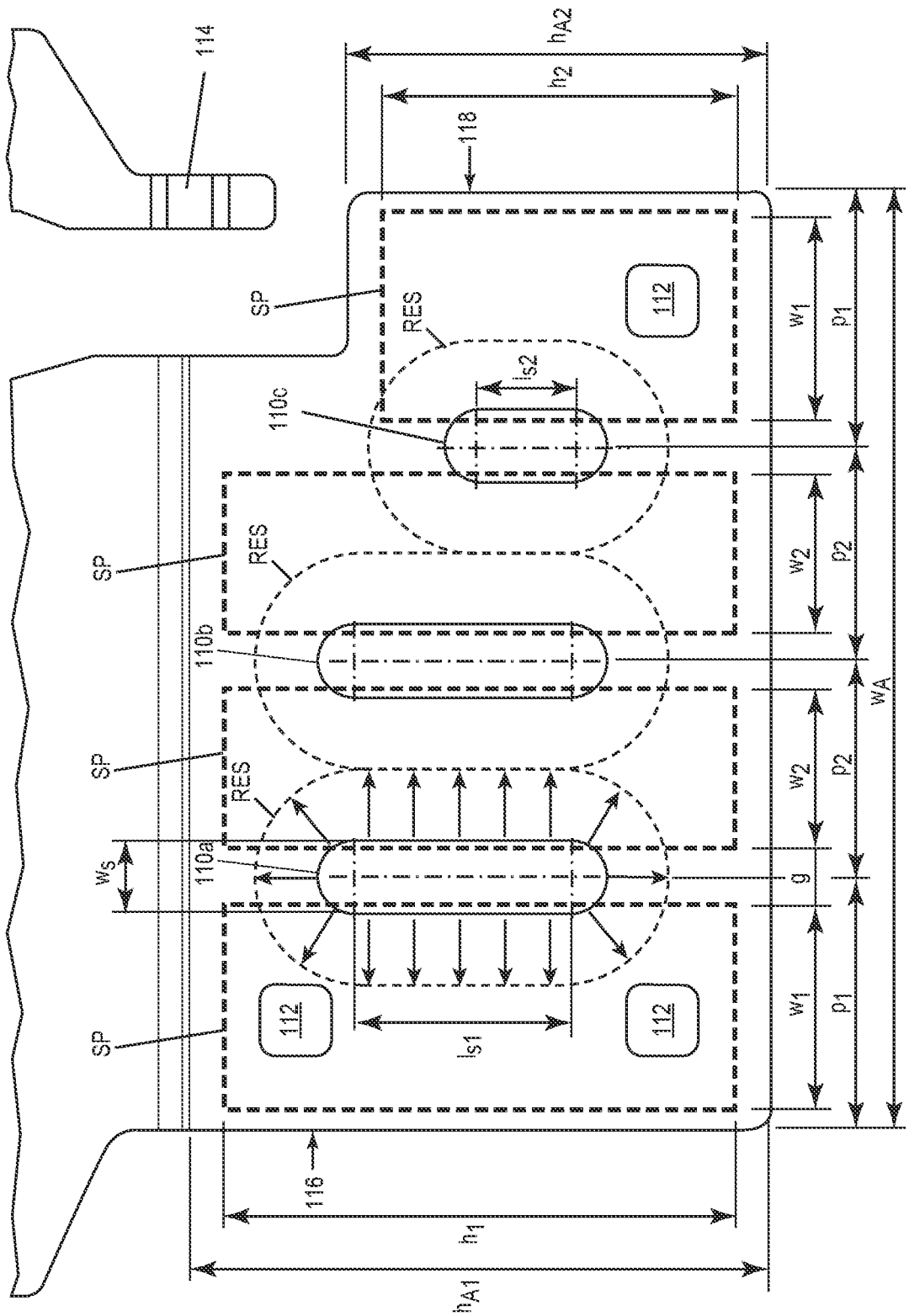
FIG. 1C illustrates a top plan view of the metal clip in FIG. 1A and including various dimensions.

FIG. 1A illustrates a bottom perspective view of a metal clip 100 designed for attachment to a semiconductor die. FIG. 1B illustrates a cross-sectional perspective view of the metal clip 100 vertically aligned with a semiconductor die 102. FIG. 1C illustrates a top plan view of the metal clip 100.

The metal clip 100 may comprise any type of metal or metal alloy such as but not limited to Cu, Al, etc. The semiconductor die 102 may comprise any type of semiconductor material such as but not limited to Si, SiC, GaN, etc. The semiconductor die 102 to which the metal clip 100 is to be attached may include a lateral or vertical power device. In the case of a lateral power device, all power and signal connections to the semiconductor die 102 are made at the front side 104 of the die 102. For example, in the case of a lateral GaN power HEMT (high-electron-mobility transistor), source, drain and gate connections may be made at the front side 104 of the die 102. In the case of a vertical power device, some power and possibly even signal connections to the semiconductor die 102 are made at the back side 106 of the die 102. For example, in the case of a vertical power MOSFET or vertical IGBT, source/emitter and gate connections may be made at the front side 104 of the die 102 and the drain/collector connection may be made at the back side 106 of the die 102. The semiconductor die 102 may include other types of power devices such as but not limited to a MOS gated diode, power diode, etc. Driver circuitry for the power device may also be included in the semiconductor die 102 as may related control circuitry. Alternatively, the control and/or driver circuitry may be located in another semiconductor die. As used herein, the term "power device" intends to describe a semiconductor device with high voltage blocking and/or high current-carrying capabilities. In other words, the semiconductor die 102 may be configured for high current, typically in the Ampere range, e.g., up to several Amperes or up to several tens or hundreds of Amperes, and/or high voltages, typically 40 V and above, e.g., up to at least 50V, up to at least 100V, up to at least 400 V or even more, e.g., up to at least 3 kV, or even up to 10 kV or more.

Regardless of the type of device included in the semiconductor die 102, the metal clip 100 is attached to the front side 104 of the semiconductor die 102 by a first soldered joint. A substrate 108 may be attached to the back side 106 of the die 102 by a second soldered joint. The substrate 108 may be a circuit board such as a single or multi-layer PCB (printed circuit board), a lead frame, a DCB (direct copper bonded) substrate, an AMB (active metal brazed) substrate, an IMS (insulated metal substrate), etc. The soldered joints used to join the metal clip 100 to the semiconductor die 102 and the die 102 to the substrate 108 are not shown in FIG. 1B to provide an unobstructed view of the metal clip features.

The metal clip 100 has a plurality of slots 110 dimensioned so as to take up at least 10% of the solder paste reflowed to form the soldered joint that attaches the metal clip 100 to the front side 104 of the semiconductor die 102. Hence, the slots 110 in the metal clip act as reservoirs for temporarily taking up some of the solder paste volume. Accordingly, the total volume of solder paste used to join the metal clip 100 to the semiconductor die 102 may be increased.

The soldered joint between the metal clip 100 and the semiconductor die 102 has a thickness t, the metal clip 100 has a thickness T, the slots 110 have a combined area S, and the metal clip 100 has a solderable area A that excludes the combined area of the slots. The thickness t of the soldered joint may be determined by standoffs or protrusions 112 at the side of the metal clip 100 which faces the semiconductor die 102. The standoffs/protrusions 112 ensure a minimum distance between the metal clip 100 and the semiconductor die 102, effectively determining the bond line thickness t of the soldered joint between the metal clip 100 and the semiconductor die 102. The standoffs/protrusions 112 may be formed, e.g., by stamping the metal clip 100.

In one embodiment, the amount of solder paste taken up by the slots 110 of the metal clip 100 during the metal clip attach process is determined by:

$$S \cdot T > 0.2 \cdot t \cdot A. \tag{1}$$

That is, according to equation (1), the clip slots 110 may take up at least 20% of the total solder paste volume during the reflow process. The clip slots 110 may take up even more of the solder paste volume during the reflow process. For example, $S \cdot T > 0.4 \cdot t \cdot A$, $S \cdot T > 0.5 \cdot t \cdot A$, or even greater.

Separately or in combination, the dimensions and number of slots 110 formed in the metal clip 100 may be a function of the flux content of the solder paste applied to the first side 104 of the first semiconductor die 102, the volume of the solder paste as applied to the first side 104 of the semiconductor die 102, and the area of the metal clip 100 facing the semiconductor die 102.

Due to die warpage that occurs during heating, the center part of the die 102 may move upwards, forcing the solder paste to squeeze out from the top of the clip slots 110. As the semiconductor die 102 cools down, the warpage decreases. During the reflow process, the solder paste stored in the slots 110 is pulled back downward toward the semiconductor die 102 by gravity and, due to surface tension/capillary forces, the solder paste spreads out laterally between the clip 100 and the die 102 to help fill the space between the bottom side of the metal clip 100 and the front side 104 of the semiconductor die 102 with very little voiding. Simulations have shown a void concentration of 1.1% or less in the final soldered joint between the metal clip 100 and the semiconductor die 102 outside the slots 110. The degree of void concentration depends on the dimensions of the metal clip 100 and the clip slots 110.

FIG. 1C shows various dimensions of the metal clip 100 and the clip slots 110. In one embodiment, one or more of the clip slots 110 has a geometric stadium shape comprising a rectangle having a length $l_s$ and width $w_s$ with semicircles at opposite first and second sides of the rectangle.

The clip slots 110 may be aligned in a single row along the largest linear dimension ($w_A$) of the metal clip 100. The largest linear dimension ($l_s$) of the slots 110 may run transverse to the largest linear dimension $w_A$ of the metal clip 100.

The clip slots 110 may have the same dimensions. Alternatively, at least one of the clip slots 110 may have one or more different dimensions compared to the other slots 110. For example, as shown in FIG. 1C, a third slot 110c may have one or more smaller dimensions ($l_{s2} < l_{s1}$) than first and second slots 110a, 110b. The third slot 110c may be positioned closer to a gate terminal of the semiconductor die 102 than the other two slots 110a, 110b. In this case, the metal clip includes a separate connection 114 which is soldered to the gate terminal of the semiconductor die 102. The semiconductor die 102 is not shown in FIG. 1C to provide an unobstructed view of the metal clip 100 but is shown in more detail in subsequent figures.

In one embodiment, the number of slots 110 formed in the metal clip 100 is determined according to:

$$n_S = \text{round}(w_A \cdot 3/5) \quad (2)$$

where $w_A$ is the largest linear dimension of the metal clip 100 and round( ) is a rounding function that returns the value of $w_A \cdot 3/5$ rounded to the nearest integer. In one embodiment, the solderable area 'A' of the metal clip 100 has a maximum linear dimension $W_A$ in a plane of the solderable area A and the clip slots 110 are arranged such that no part of the solderable area A is further than $0.1 \cdot W_A$ from either at least one of the slots 110 or a respective edge 116, 118 of the solderable area A of the metal clip 100.

The dimensions of the slots 110 may be determined according to:

$$l_{s1} = h_{A1} \cdot 8/3 \quad (3)$$

$$l_{s2} = h_{A2} \cdot 9/2 \quad (4)$$

$$w_s = l_{s1}/3 \quad (5)$$

where $l_s$ and $h_A$ are linear dimensions of the slots 110 and the clip 100, respectively, as shown in FIG. 1C. In FIG. 1C, the metal clip 100 has a notch in the upper right corner to accommodate the separate gate terminal connection 114. In this example, $h_{A2} < h_{A1}$.

The dimensions of the solder paste (segments) islands applied to the front side 104 of the semiconductor die 102 for joining the metal clip 100 to the die 102, and which are indicated by dashed rectangles labelled 'SP' in FIG. 1C, may be determined according to:

$$h_1 = h_{A1} \cdot 9/10 \quad (6)$$

$$h_2 = h_{A2} \cdot 8/10 \quad (7)$$

$$((w_1 + (n_S-1)w_2) \cdot h_1 + w_1 \cdot h_2) \cdot s_t = V \cdot f_C \quad (8)$$

$$2 \cdot w_1 + (n_S-1) \cdot w_2 = w_A \cdot 9/10 \quad (9)$$

and by solving the system of equations (8) and (9) for the unknowns $w_1$ and $w_2$. The solder paste islands SP may have the same or different dimensions, depending on the design of the metal clip 100 and the dimensions and positioning of the slots 110.

In equation (8), fc is the flux content of the solder paste islands SP and V is the total volume of the solder paste islands SP. The flux content $f_c$ typically ranges from 0.4 to 0.6. The target volume of solder paste may be determined according to:

$$V = A \cdot t/f_c \quad (10)$$

The position of the solder paste islands SP may be determined according to:

$$2 \cdot p_1 + (n_S-1) \cdot p_2 = w_A \quad (11)$$

$$p_1/p_2 = 8/10 \quad (12)$$

and by solving the system of equations (11) and (12) for the two unknowns $p_1$ and $p_2$. Parameter p1 corresponds to the distance from a centerline (g) of each slot 110 positioned closest to an edge 116, 118 of the metal clip 100 to the edge 116, 118 and parameter p2 corresponds to the centerline-to-centerline spacing between slots 110.

As explained above, solder paste stored in the clip slots 110 is pulled back downward toward the semiconductor die 102 by gravity during the reflow process and, due to surface tension/capillary forces, spreads out laterally between the clip 100 and the die 102. The degree of lateral spread by the solder paste pulled downward from the clip slots 110 during the reflow process is represented by the dashed ovals labelled 'RES' in FIG. 1C.

In one embodiment, the slots 110 of the metal clip 100 are laterally offset from the solder paste islands SP after the metal clip 100 is placed over the first side 104 of the corresponding semiconductor die 102 and before the metal clip 110 is pressed toward the semiconductor die 102. The slots 110 of the metal clip 100 may partly laterally overlap with the solder paste islands SP after the metal clip 100 is placed over the first side 104 of the semiconductor die 102 and before the metal clip 100 is pressed toward the semiconductor die 102, e.g., as indicated by the overlap between dimensions ws and both w1 and w2 in FIG. 1C.

FIGS. 2A through 2F illustrate an embodiment of a method of clip soldering. According to this embodiment, the method batch produces semiconductor devices. FIGS. 2A through 2F show partial top perspective views during different stages of the clip soldering method.

Figure 2A:
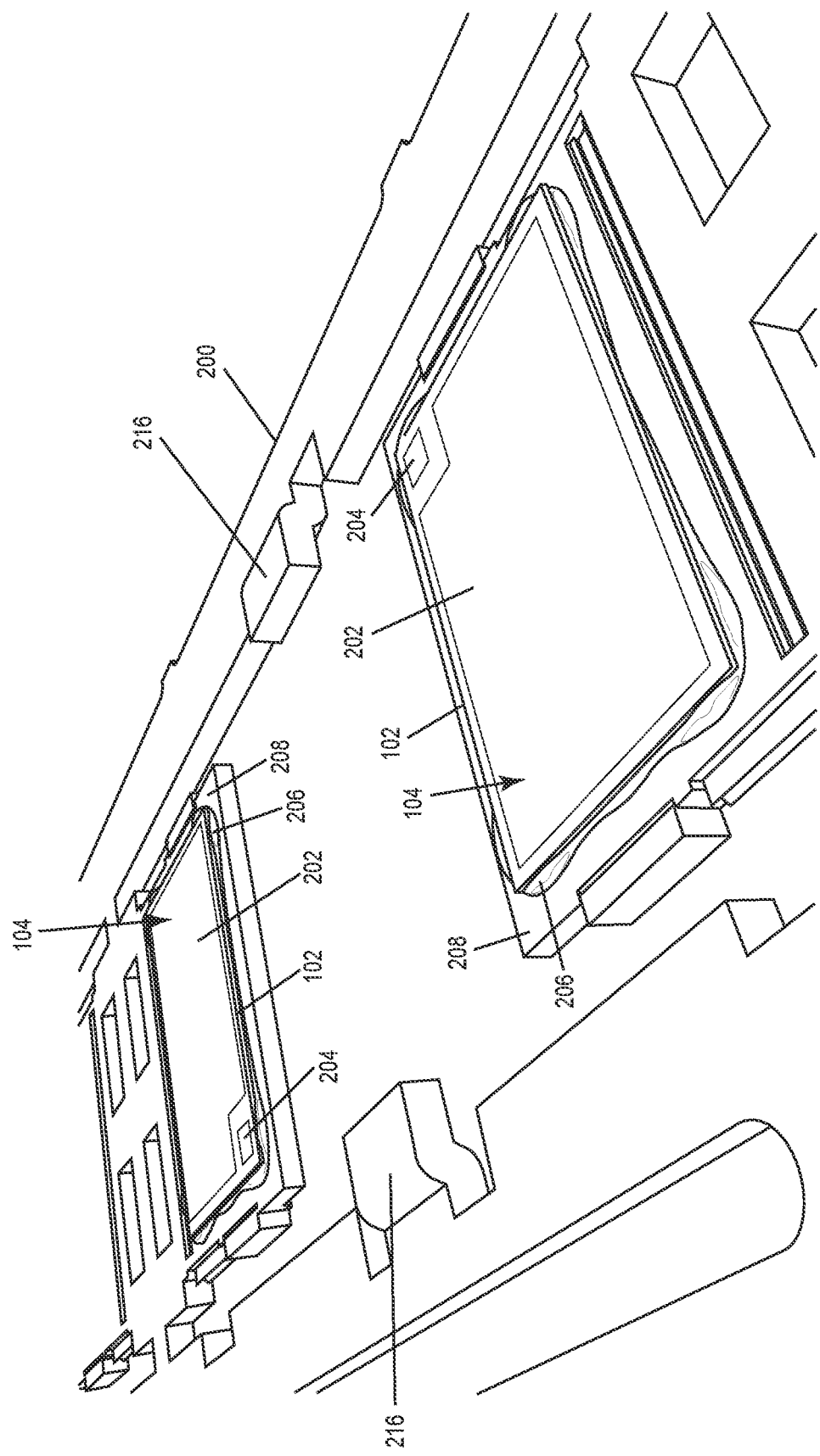
FIGS. 2A through 2F illustrate partial top perspective views of an embodiment of a method of clip soldering.

FIG. 2A shows a plurality of semiconductor dies 102 placed on a leadframe structure 200. The front side 104 of each semiconductor die 102 faces away from the leadframe structure 200 and may include a first power terminal 202 and a gate terminal 204. The back side 106 (out of view in FIGS. 2A through 2F) of each semiconductor die 102 faces the leadframe structure and may include a second power terminal (also out of view). In this example, the semiconductor dies 102 may include a vertical power MOSFET or a vertical IGBT device. Regardless of the type of device, a die attach material 206 such as solder paste or an adhesive material is interposed between the back side 106 of each semiconductor die 102 and a corresponding substrate 208 of the leadframe structure 200. In the illustrated example, the substrates 208 are part of the leadframe structure 200. However, other types of substrates may be used such as DCB substrates, AMB substrates, IMSs, etc., as previously described herein.

Figure 2B:
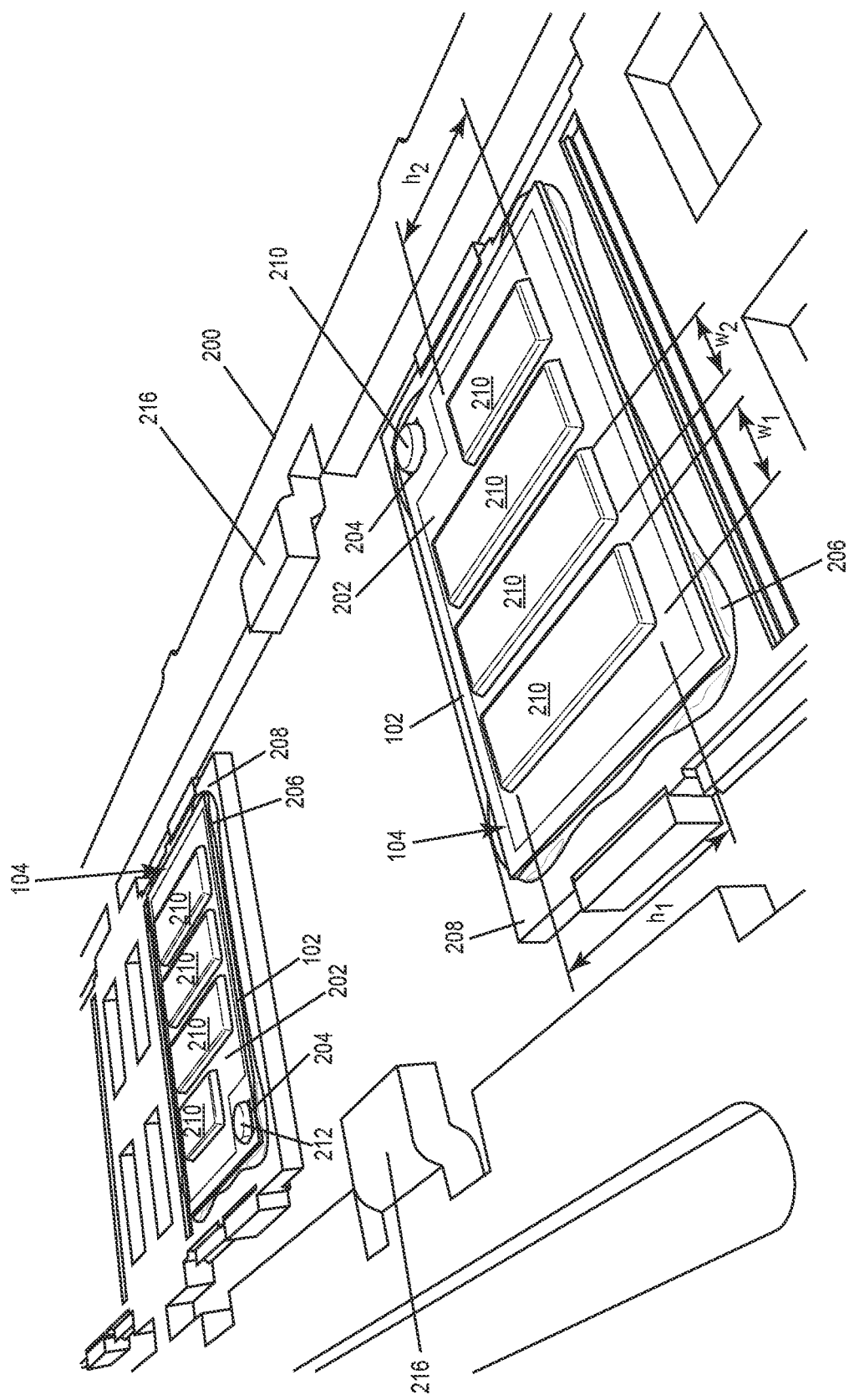

Continuing with the leadframe structure embodiment, FIG. 2B shows solder paste 210 applied in islands to the front side 104 of each semiconductor die 102 which faces away from the leadframe structure 200, the islands being separated from one another. The solder paste 210 may be applied to the front side 104 of the semiconductor dies 102 by printing, writing, etc. The dimensions $h_1$, $h_2$, $w_1$, $w_2$, etc. and positions $p_1$, $p_2$, etc. of the islands of solder paste 210 may be determined in accordance with the corresponding equations presented above, for example.

Figure 2C:
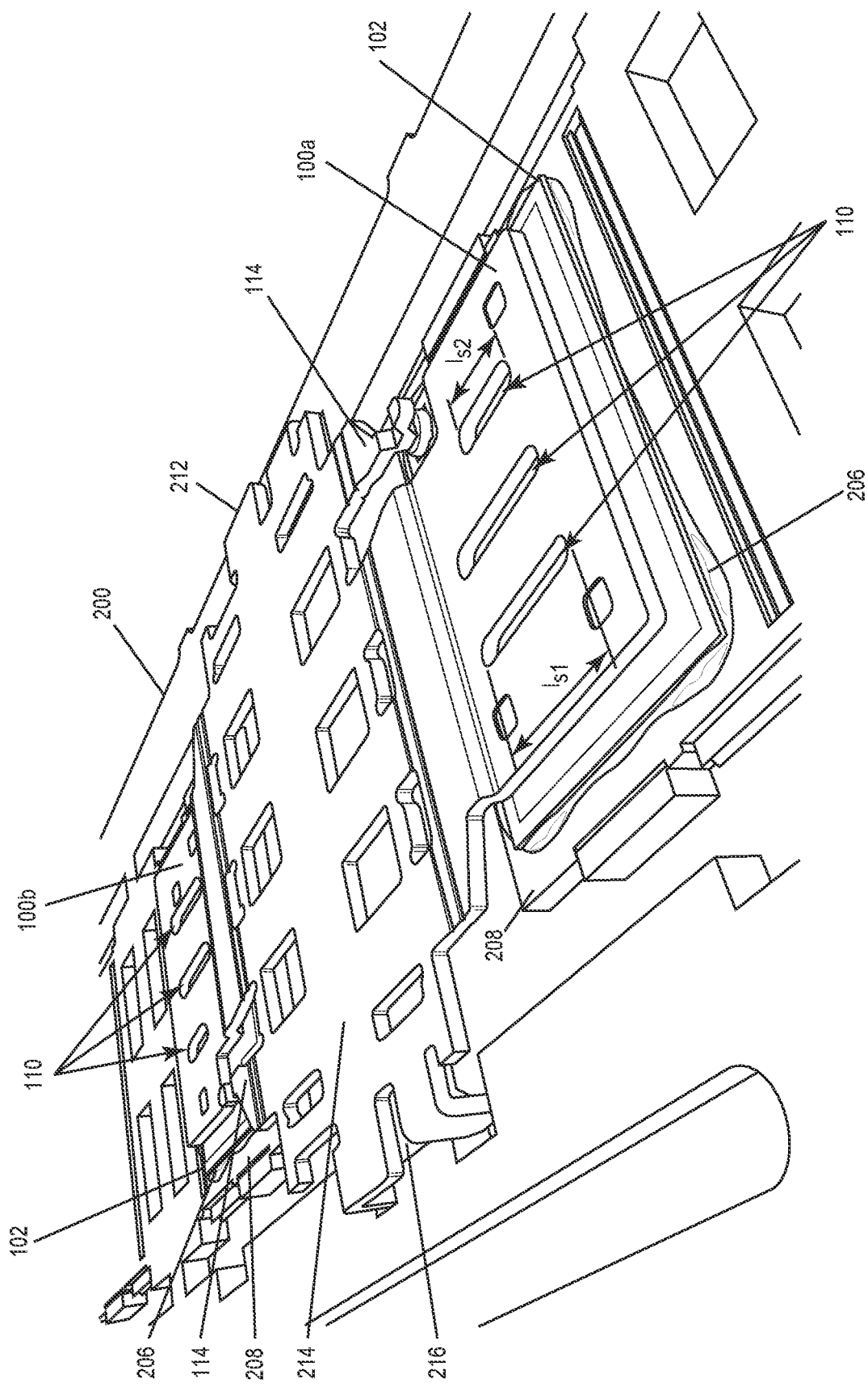

FIG. 2C shows a metal clip structure 212 vertically aligned with an adjacent pair of the semiconductor dies 102. The metal clip structure 212 includes a first metal clip 100a integrally joined to a second metal clip 100b by a bridging section 214. According to this embodiment, both metal clips 100a, 100b are simultaneously placed over the first side 104 of the respective semiconductor dies 102.

Each metal clip 100a, 100b has a plurality of slots 110 dimensioned so as to take up at least 10% of the solder paste 210 when the metal clip 100a, 100b is pressed toward the corresponding semiconductor die 102 vertically aligned with the metal clip 100a, 100b. As explained above, FIGS. 2A through 2F are partial perspective views. As such, only one metal clip structure 212 is illustrated. However, multiple metal clip structures 212 may be processed with the leadframe structure 200.

The dimensions ls1, ls2, $w_s$, etc. and positioning of the clip slots 110 may be determined in accordance with the corresponding equations presented above, for example. Also as explained above, the clip slots 110 may have the same dimensions or at least one of the clip slots 110 may have one or more different dimensions compared to the other slots 110. For example, one of the slots 110 may have one or more smaller dimensions ($l_{s2} < l_{s1}$) than the other slots 110 and this third slot 110 may be positioned closer to the gate terminal 204 of the corresponding semiconductor die 102 than the other slots 110. In this case, the metal clip 100a, 100b includes a separate connection 114 which is soldered to the gate terminal 204 of the corresponding semiconductor die 102. The other (larger) slots 110 having the same dimensions are positioned over the first power terminal 202 of the corresponding semiconductor die 102.

Figure 2D:
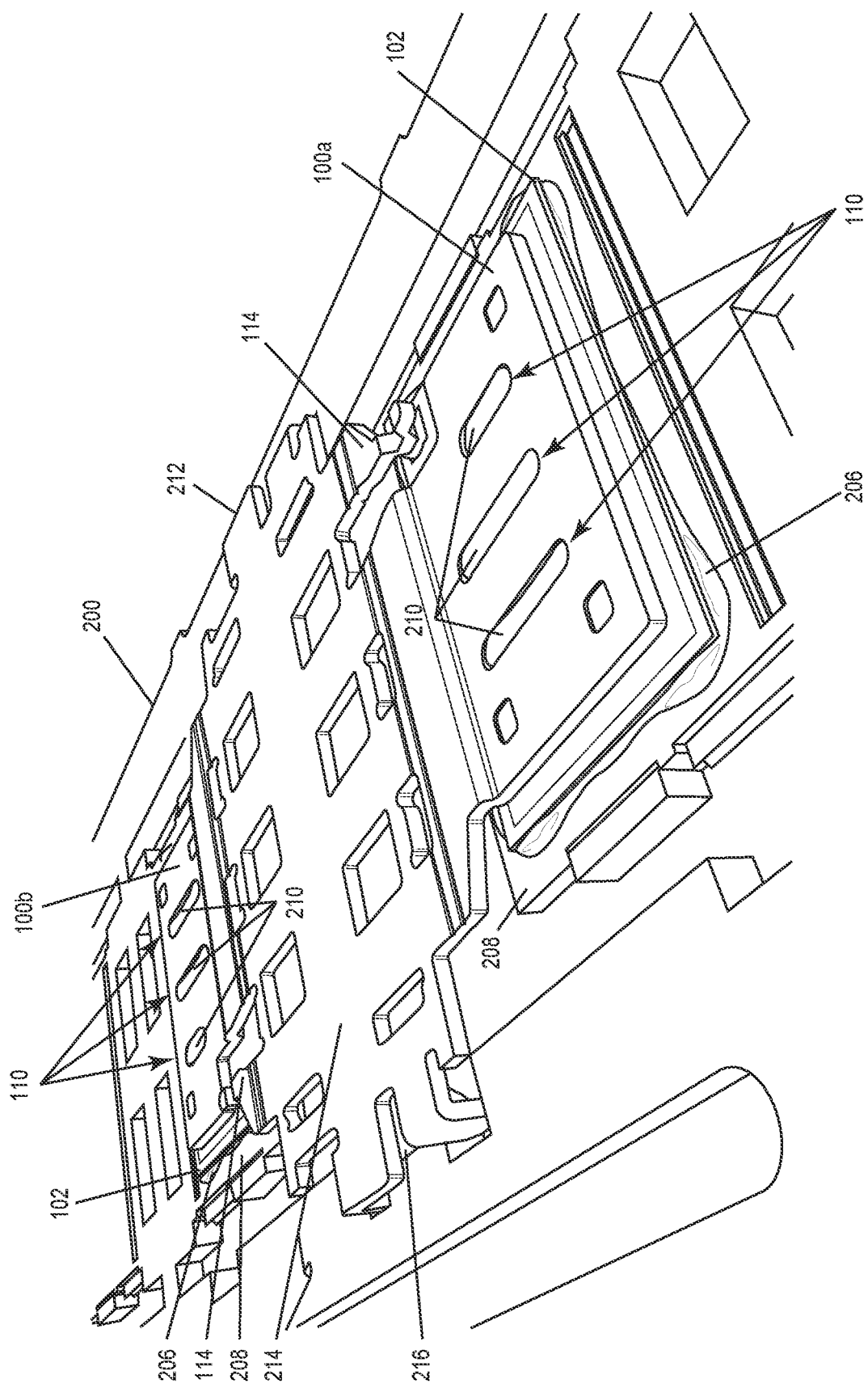

FIG. 2D shows final placement of each metal clip structure 212. As part of the final placement, each metal clip structure 212 is pressed toward the corresponding pair of semiconductor dies 102 vertically aligned with the metal clip structure 212 until the bridging section 214 of the metal clip structure 212 contacts a hard stop 216 of the leadframe structure 200. The hard stop 216 may be a tab or other type of raised or elevated region, e.g., stamped or punched into the leadframe structure 200. The hard stop 216 prevents further downward pressing of the metal clip structure 212.

The hard stop 216 of the leadframe structure 200 may be used to determine a defined distance t between each metal clip 100a, 100b and the corresponding semiconductor die 102 vertically aligned with the metal clip 100a, 100b. Accordingly, the height of the hard stop 216 may determine the bondline thickness of the soldered joint to be formed between the metal clips 100a, 100b and the respective semiconductor dies 102.

As previously described herein, each metal clip 100a, 100b has a thickness T, the slots 110 of each metal clip 100a, 100b have a combined area S, and each metal clip 100a, 100b has a solderable area A (out of view in FIGS. 2A through 2F) that excludes the combined area of the slots 110. The amount of solder paste 210 taken up by the slots 110 of each metal clip 100a, 100b during the metal clip attach process may be determined by equation (1). For example, $S \cdot T > 0.1 \cdot t \cdot A$, $S \cdot T > 0.2 \cdot t \cdot A$, $S \cdot T > 0.4 \cdot t \cdot A$, $S \cdot T > 0.5 \cdot t \cdot A$, or even greater. Accordingly, at least 10% of the solder paste 210 is forced into the slots 110 of the metal clips 100a, 100b of each clip structure 214 by the pressing.

Figure 2E:
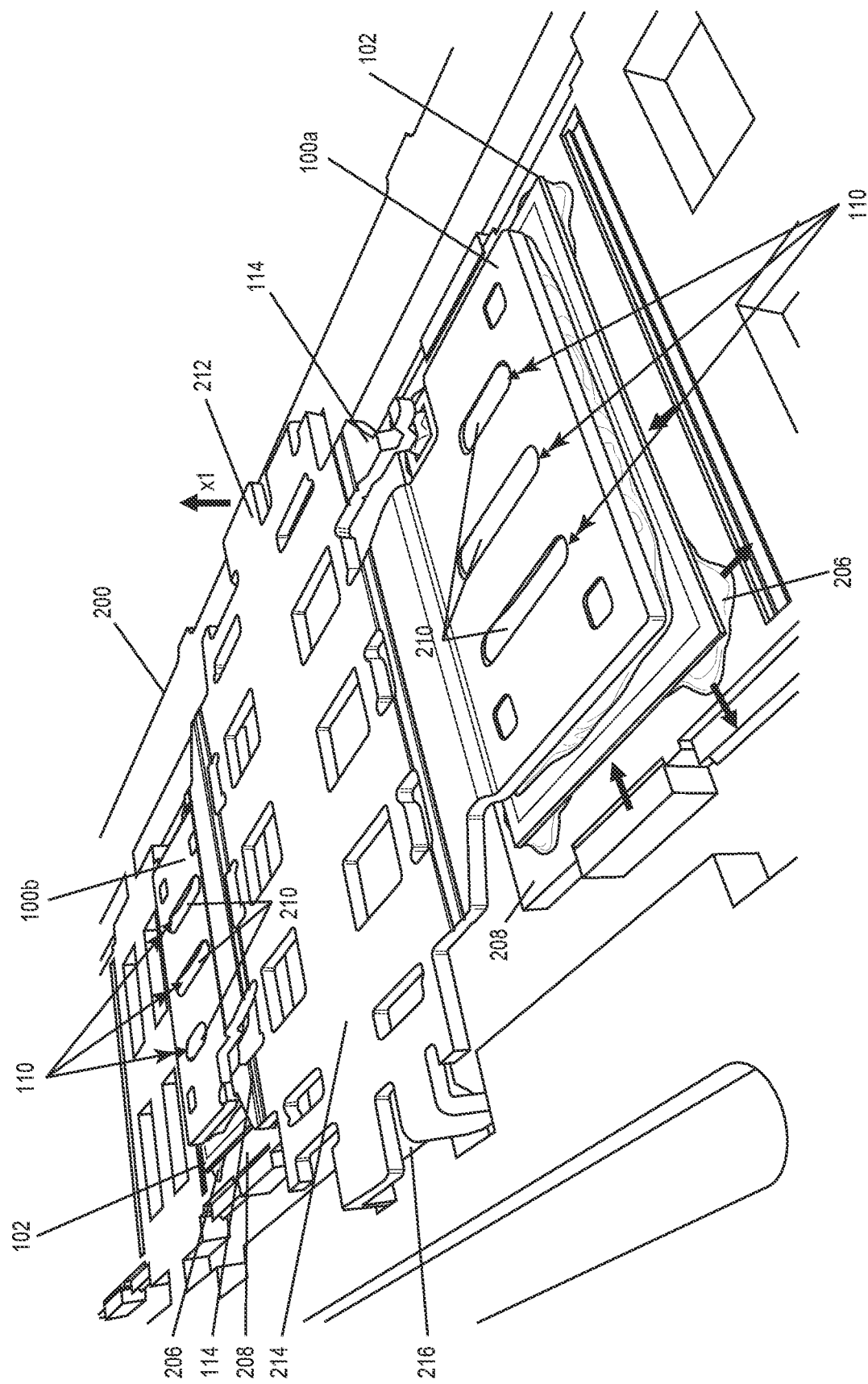

FIG. 2E shows an intermediate (high temperature) stage of the solder reflow process. Die warpage occurs during the intermediate stage. The die warpage causes each metal clip structure 212 to move upwards by an amount 'x1' as indicated by the vertical arrow in FIG. 2E. Also due to the die warpage, and if solder paste is used as the die attach material 206 between the semiconductor dies 102 and the corresponding substrates 208, the solder paste 206 squeezes out in some regions as indicated by the outward-facing lateral arrows in FIG. 2E and is pulled inward as indicated by the inward-facing lateral arrows in FIG. 2E.

Figure 2F:
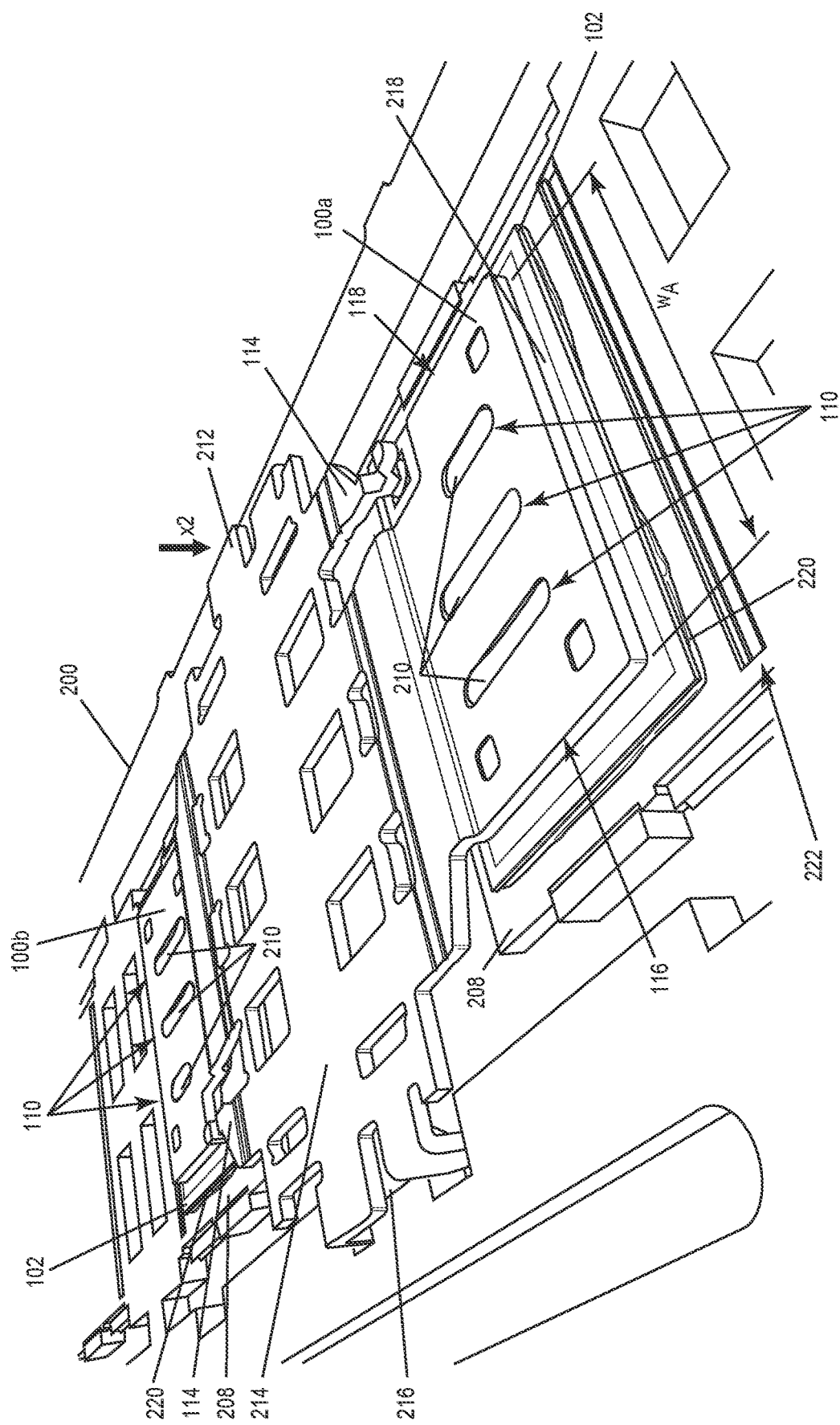

FIG. 2F shows completion of the solder reflow process. The reflowed solder paste forms a soldered joint 218 between each metal clip 100a, 100b and the corresponding semiconductor die 102 vertically aligned with the metal clip 100a, 100b. Simulations for the metal clip design shown in FIGS. 2A through 2F have shown a void concentration of 0.8% in the soldered joint 218 between the metal clips 100a, 100b and the respective semiconductor dies 102 outside the clip slots 110.

The solder paste 210 at least partly retracts from the slots 110 of the metal clips 100a, 100b during the reflowing to form part of the respective soldered joints 218. That is, at least some solder may remain in the clip slots after comple- tion of the reflow process. If solder paste is used as the die attach material 206 between the semiconductor dies 102 and the corresponding substrates 208, a second soldered joint 220 is formed between each semiconductor die 102 and the corresponding substrate 208 vertically aligned with the die 102.

The die warpage decreases as the semiconductor dies 102 cool down toward the end of the solder reflow process when the solder paste 210 solidifies into the respective soldered joints 218. Accordingly, each metal clip structure 212 moves downward by an amount 'x2' toward the end of the solder reflow process as indicated by the vertical arrow in FIG. 2F. The extent of downward movement x2 toward the end of the solder reflow process is less than the earlier upward movement x1 ($x2 < x1$) during the intermediate (high temperature) stage of the reflow process, such that the metal clips 100a, 100b remain lifted upward after completion of the reflow process.

Depending on the type of final module to be produced, the semiconductor devices may or may not be molded. In either case, individual semiconductor devices are formed by severing connections 222 to the leadframe structure 200 and between the metal clips 100a, 100b of each metal clip structure 212 at the bridging section 214, e.g., by stamping, cutting, sawing, etching, etc.

As explained above, the clip-to-die soldered joint 218 for each individual semiconductor device has a thickness t, the metal clip 100a, 100b has a thickness T, the clip slots 110 have a combined area S, and the metal clip 100a, 100b has a soldered area SA that excludes the combined area of the slots 110 and where the soldered area SA is the area of the metal clip 100a, 100b covered by the corresponding (final) soldered joint 218 and $S \cdot T > 0.1 \cdot t \cdot SA$, $S \cdot T > 0.2 \cdot t \cdot SA$, $S \cdot T > 0.4 \cdot t \cdot SA$, $S \cdot T > 0.5 \cdot t \cdot SA$, or even greater. The soldered area SA of each metal clip 100a, 100b may have a maximum linear dimension $W_A$ in a plane of the soldered area SA and the clip slots 110 may be arranged such that no part of the soldered area SA is further than $0.1 \cdot W_A$ from either at least one of the slots 110 or a respective edge 116, 118 of the soldered area SA of the metal clip 100a, 100b.

Figure 3:
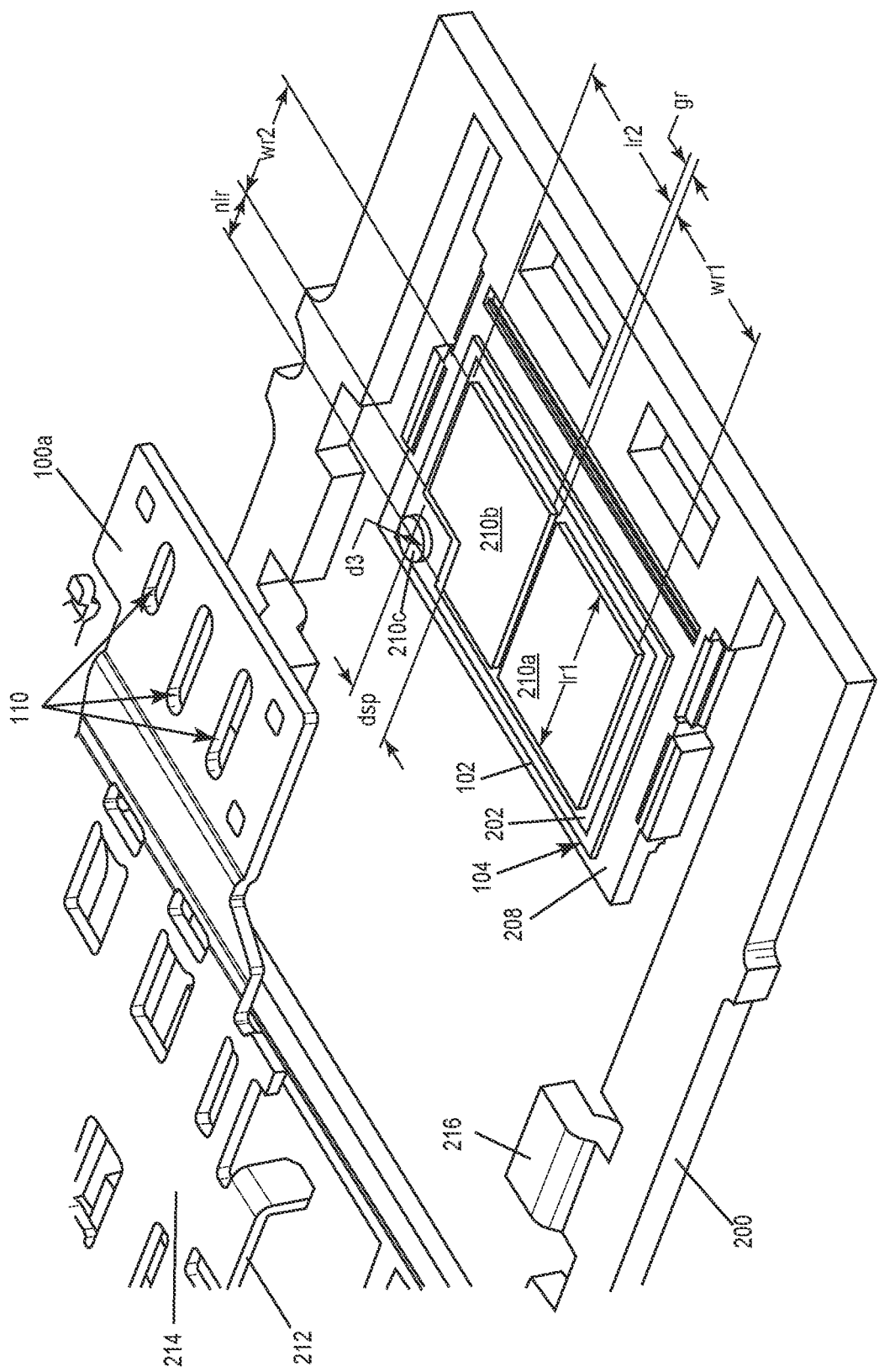
FIG. 3 illustrates a partial top perspective view of another embodiment of applying solder paste in islands to a semiconductor die aligned with a metal clip having reservoirs for holding solder paste during solder reflow.

FIG. 3 illustrates a partial top perspective view of another embodiment of applying the solder paste 210 in islands to the front side 104 of each semiconductor die 102 which faces away from the leadframe structure 200. Compared to the embodiment shown in FIGS. 2A through 2F, the solder paste 210 in FIG. 3 has fewer islands.

According to the embodiment of FIG. 3, two rectilinear islands 210a, 210b of solder paste 210 are applied to the first power terminal 202 of each semiconductor die 102 and a round island 210c is applied to the gate terminal 204. The round island 210c of solder paste 210 has a diameter d3. The first rectilinear island 210a of solder paste 210 has a rectangular shape with a width wr1 and a length lr1. The second rectilinear island 210b of solder paste 210 has a first linear dimension lr2 greater than a second linear dimension w2r. A notch is formed in the corner of the second rectilinear island 210b of solder paste 210 closest to the gate terminal 204 of the semiconductor die 102. The notch has a linear dimension nlr. The center of the round island 210c of solder paste 210 is spaced from a facing edge of the notch in the second rectilinear island 210b of solder paste 210 by a distance dsp. The two rectilinear islands 210a, 210b of solder paste 210 are spaced apart from one another by a gap gr. Simulations for the metal clip design shown in FIG. 3 have shown a void concentration of 0.9% in the soldered joint formed between the metal clips 100a, 100b and the respective semiconductor dies 102 outside the clip slots 110.

Figure 4A:
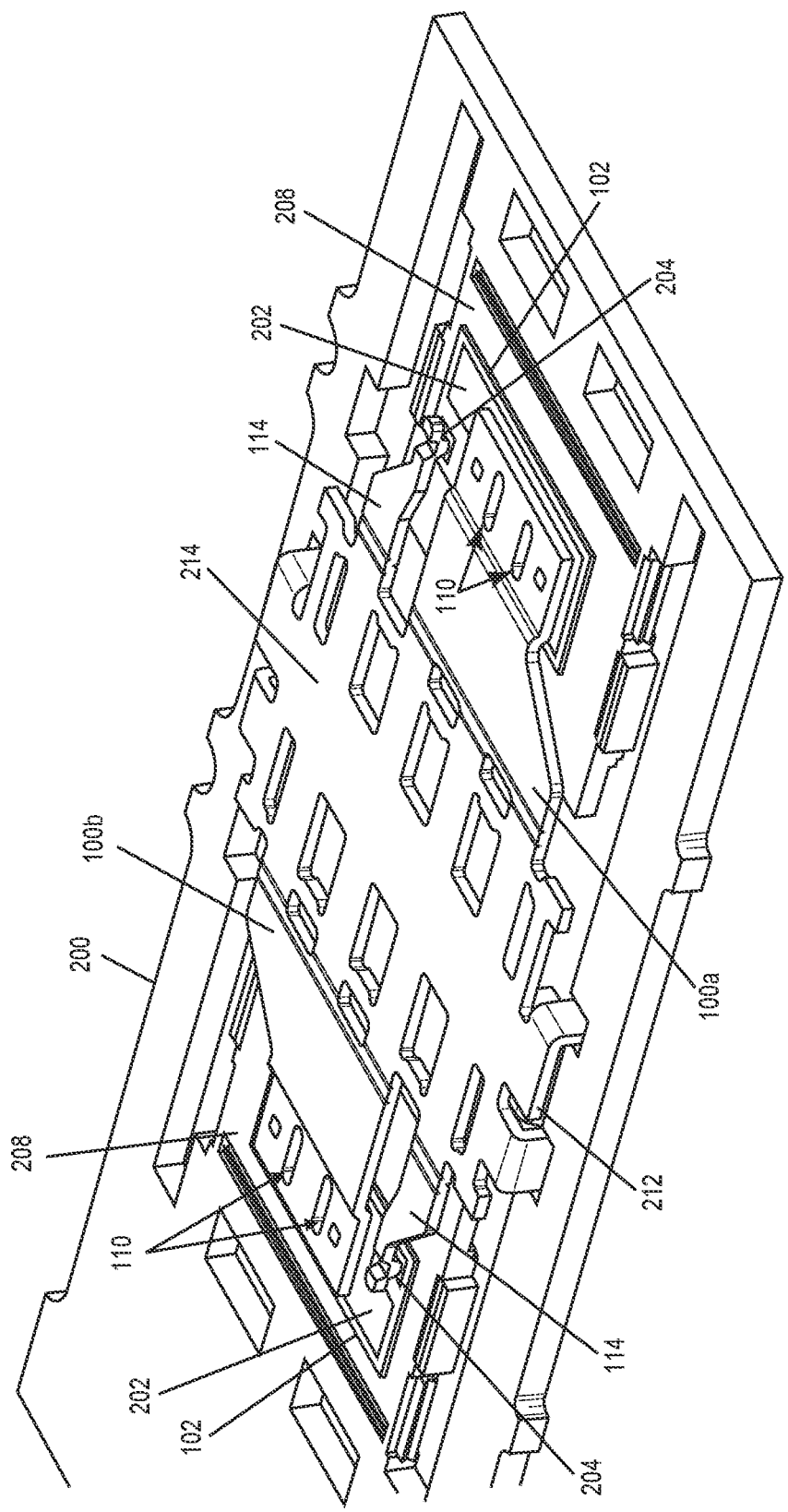
FIGS. 4A and 4B illustrate respective partial top perspective views of another embodiment of applying solder paste in islands to a semiconductor die aligned with a metal clip having reservoirs for holding solder paste during solder reflow.
Figure 4B:
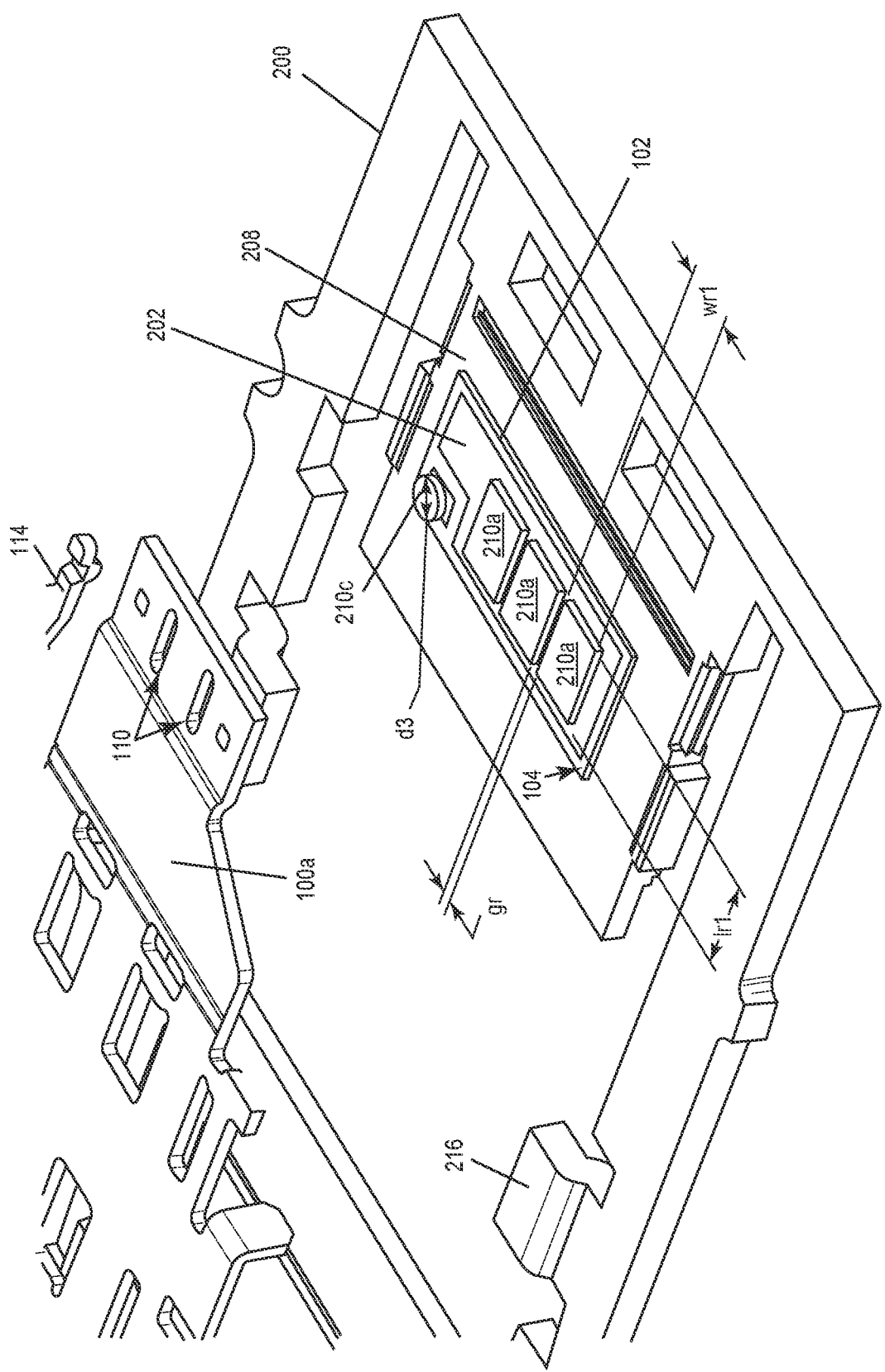

FIGS. 4A and 4B illustrate respective partial top perspective views of another embodiment of applying the solder paste 210 in islands to the front side 104 of each semiconductor die 102 which faces away from the leadframe structure 200. FIG. 4A shows a metal clip structure 212 placed on a leadframe structure 200 but without the solder paste, to provide an unobstructed view of the metal clip structure 212 and the leadframe structure 200. FIG. 4B shows the metal clip structure 212 during placement with the solder paste 210 applied to the front-side terminals 202, 204 of one of the semiconductor dies 102.

As shown in FIG. 4A, the metal clips 100a, 100b have one fewer slot 110 than the metal clips 100a, 100b shown in FIGS. 2A through 2F and in FIG. 3. Also, compared to FIG. 3, three smaller rectilinear islands 210a of solder paste 210 and having the same dimensions (lr1, wr1) are applied to the first power terminal 202 of the semiconductor die 102 in FIG. 4. Accordingly, in FIG. 4, the rectilinear island 210a of solder paste 210 closest to the gate terminal 204 of the semiconductor die 102 does not have a notch formed therein. Simulations for the metal clip design shown in FIGS. 4A and 4B have shown a void concentration of 1.1% in the soldered joint formed between the metal clips 100a, 100b and the respective semiconductor dies 102 outside the clip slots 110. Still other metal clip designs and solder paste configurations may be realized.

Although the present disclosure is not so limited, the following numbered examples demonstrate one or more aspects of the disclosure.

Example 1. A method of clip soldering, comprising: applying solder paste to a first side of a first semiconductor die; placing a first metal clip over the first side of the first semiconductor die with the solder paste, the first metal clip having a plurality of slots dimensioned so as to take up at least 10% of the solder paste when the first metal clip is pressed toward the first semiconductor die; pressing the first metal clip toward the first semiconductor die, wherein at least 10% of the solder paste is forced into the slots by the pressing; and reflowing the solder paste to form a soldered joint between the first metal clip and the first semiconductor die, wherein the solder paste at least partly retracts from the slots during the reflowing to form part of the soldered joint.

Example 2. The method of example 1, wherein applying the solder paste to the first side of the first semiconductor die comprises: applying a plurality of solder paste islands to the first side of the first semiconductor die, the solder paste islands being separated from one another, wherein the slots of the first metal clip are laterally offset from the solder paste islands after the first metal clip is placed over the first side of the first semiconductor die and before the first metal clip is pressed toward the first semiconductor die.

Example 3. The method of example 2, wherein the slots of the first metal clip partly laterally overlap with the solder paste islands after the first metal clip is placed over the first side of the first semiconductor die and before the first metal clip is pressed toward the first semiconductor die.

Example 4. The method of any of examples 1 through 3, wherein the first side of the first semiconductor die includes a first power terminal and a gate terminal, wherein a second side of the first semiconductor die opposite the first side includes a second power terminal, and wherein the first metal clip comprises at least two slots having the same dimensions and positioned over the first power terminal when the first metal clip is placed over the first side of the first semiconductor die.

Example 5. The method of example 4, wherein the first metal clip further comprises a third slot having one or more smaller dimensions than the at least two slots and positioned closer to the gate terminal than the at least two slots when the first metal clip is placed over the first side of the first semiconductor die.

Example 6. The method of any of examples 1 through 5, wherein the slots of the first metal clip have a geometric stadium shape comprising a rectangle with semicircles at opposite first and second sides of the rectangle.

Example 7. The method of any of examples 1 through 6, wherein the dimensions and number of the slots of the first metal clip are a function of a flux content of the solder paste as applied to the first side of the first semiconductor die, the volume of the solder paste as applied to the first side of the first semiconductor die, and the area of the first metal clip facing the first semiconductor die.

Example 8. The method of any of examples 1 through 7, wherein the first metal clip is attached to a second metal clip through an integral bridging section, the method further comprising: applying solder paste to a first side of a second semiconductor die; placing the second metal clip over the first side of the second semiconductor die simultaneously with placing the first metal clip over the first side of the first semiconductor die, the second metal clip having a plurality of slots dimensioned so as to take up at least 10% of the solder paste applied to the first side of the second semiconductor die when the second metal clip is pressed toward the second semiconductor die; pressing the second metal clip toward the second semiconductor die simultaneously with pressing the first metal clip toward the first semiconductor die, wherein at least 10% of the solder paste applied to the first side of the second semiconductor die is forced into the slots of the second metal clip by the pressing; and reflowing the solder paste applied to the first side of the second semiconductor die to form a soldered joint between the second metal clip and the second semiconductor die, wherein the solder paste applied to the first side of the second semiconductor die at least partly retracts from the slots of the second metal clip during the reflowing to form part of the soldered joint between the second metal clip and the second semiconductor die.

Example 9. The method of example 8, wherein pressing the second metal clip toward the second semiconductor die simultaneously with pressing the first metal clip toward the first semiconductor die comprises: pressing downward on the first and the second metal clips in a direction toward a leadframe structure to which the first and the second semiconductor dies are attached and until the bridging section contacts a hard stop of the leadframe structure, wherein a height of the hard stop determines a bondline thickness of the soldered joint between the first metal clip and the first semiconductor die and a bondline thickness of the soldered joint between the second metal clip and the second semiconductor die.

Example 10. The method of any of examples 1 through 9, wherein at least 20% of the solder paste is forced into the slots of the first metal clip by the pressing.

Example 11. The method of any of examples 1 through 10, wherein the first metal clip is placed at a defined distance t from the first side of the first semiconductor die, wherein the metal clip has a thickness T, wherein the slots have a combined area S, wherein the metal clip has a solderable area A covered by the solder paste and that excludes the combined area of the slots, and wherein $S \cdot T > 0.2 \cdot t \cdot A$.

Example 12. The method of example 11, wherein $S \cdot T > 0.4 \cdot t \cdot A$.

Example 13. The method of example 11 or 12, wherein the solderable area of the metal clip has a maximum linear dimension $W_A$ in a plane of the solderable area and the slots are arranged such that no part of the solderable area is further than $0.1 \cdot W_A$ from either at least one of the slots or an edge of the solderable area of the metal clip.

Example 14. A method of batch producing semiconductor devices, the method comprising: placing a plurality of semiconductor dies on a leadframe structure; applying solder paste to a side of each semiconductor die facing away from the leadframe structure; vertically aligning a metal clip structure with each adjacent pair of the semiconductor dies, each metal clip structure comprising a first metal clip integrally joined to a second metal clip by a bridging section, each metal clip having a plurality of slots dimensioned so as to take up at least 10% of the solder paste when the metal clip is pressed toward the semiconductor die vertically aligned with the metal clip; pressing each metal clip structure toward the pair of semiconductor dies vertically aligned with the metal clip structure and until the bridging section of each metal clip structure contacts a hard stop of the leadframe structure, wherein at least 10% of the solder paste is forced into the slots of the metal clips of each clip structure by the pressing; reflowing the solder paste to form a soldered joint between each metal clip and the semiconductor die vertically aligned with the metal clip, wherein the solder paste at least partly retracts from the slots of the metal clips during the reflowing to form part of the soldered joints; and severing connections to the leadframe structure and between the metal clips of each metal clip structure at the bridging section, to form individual semiconductor devices.

Example 15. The method of example 14, wherein the hard stop of the leadframe structure determine a defined distance t between each metal clip and the semiconductor die vertically aligned with the metal clip, wherein each metal clip has a thickness T, wherein the slots of each metal clip have a combined area S, wherein each metal clip has a solderable area A that excludes the combined area of the slots, and wherein $S \cdot T > 0.2 \cdot t \cdot A$.

Example 16. The method of example 15, wherein $S \cdot T > 0.4 \cdot t \cdot A$.

Example 17. A semiconductor device, comprising: a semiconductor die attached to a substrate; and a metal clip attached to a side of the semiconductor die facing away from the substrate by a soldered joint, wherein the metal clip has a plurality of slots dimensioned so as to take up at least 10% of a solder paste reflowed to form the soldered joint.

Example 18. The semiconductor device of example 17, wherein the side of the semiconductor die facing away from the substrate includes a first power terminal and a gate terminal, wherein a side of the semiconductor die facing the substrate includes a second power terminal, and wherein the metal clip comprises at least two slots having the same dimensions and positioned over the first power terminal.

Example 19. The semiconductor device of example 18, wherein the metal clip further comprises a third slot having one or more smaller dimensions than the at least two slots and positioned closer to the gate terminal than the at least two slots.

Example 20. The semiconductor device of any of examples 17 through 19, wherein the slots of the metal clip have a geometric stadium shape comprising a rectangle with semicircles at opposite first and second sides of the rectangle.

Example 21. The semiconductor device of any of examples 17 through 20, wherein the soldered joint has a thickness t, wherein the metal clip has a thickness T, wherein the slots have a combined area S, wherein the metal clip has a soldered area A that excludes the combined area of the slots, and wherein $S \cdot T > 0.2 \cdot t \cdot A$.

Example 22. The semiconductor device of example 21, wherein $S \cdot T > 0.4 \cdot t \cdot A$.

Example 23. The semiconductor device of any of examples 17 through 22, wherein the slots are aligned in a single row along the largest linear dimension of the metal clip.

Example 24. The semiconductor device of example 23, wherein the largest linear dimension of the slots runs transverse to the largest linear dimension of the metal clip.

Example 25. The semiconductor device of any of examples 16 through 24, wherein the number (nS) of the slots is given by $nS = \text{round}(wA \cdot 3/5)$ where wA is the largest linear dimension of the metal clip.

Example 26. The semiconductor device of example 25, wherein $2 \cdot p1 + (nS-1) \cdot p2 = wA$ where p1 is the distance from a centerline of each slot positioned closest to an edge of the metal clip to the edge and p2 is the centerline-to-centerline spacing between the slots.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor die attached to a substrate; and
a metal clip attached to a side of the semiconductor die facing away from the substrate by a soldered joint,
wherein the metal clip has a plurality of slots dimensioned so as to take up at least 10% of a solder paste that reflowed to form the soldered joint.

2. The semiconductor device of claim 1, wherein the side of the semiconductor die facing away from the substrate includes a first power terminal and a gate terminal, wherein a side of the semiconductor die facing the substrate includes a second power terminal, and wherein the metal clip comprises at least two slots having the same dimensions and positioned over the first power terminal.

3. The semiconductor device of claim 2, wherein the metal clip further comprises a third slot having one or more smaller dimensions than the at least two slots and positioned closer to the gate terminal than the at least two slots.

4. The semiconductor device of claim 1, wherein the slots of the metal clip have a geometric stadium shape comprising a rectangle with semicircles at opposite first and second sides of the rectangle.

5. The semiconductor device of claim 1, wherein the soldered joint has a thickness t, wherein the metal clip has a thickness T, wherein the slots have a combined area S, wherein the metal clip has a soldered area A that excludes the combined area of the slots, and wherein S·T>0.2·t·A.

6. The semiconductor device of claim 5, wherein S·T>0.4·t·A.

7. The semiconductor device of claim 5, wherein S·T>0.5·t·A.

8. The semiconductor device of claim 1, wherein the slots are aligned in a single row along the largest linear dimension of the metal clip.

9. The semiconductor device of claim 8, wherein the largest linear dimension of the slots runs transverse to the largest linear dimension of the metal clip.

10. The semiconductor device of claim 1, wherein the number ($n_S$) of the slots is given by $n_S$=round($w_A$·⅗) where $w_A$ is the largest linear dimension of the metal clip.

11. The semiconductor device of claim 10, wherein 2·p1+($n_S$−1)·p2=$w_A$ where p1 is the distance from a centerline of each slot positioned closest to an edge of the metal clip to the edge and p2 is the centerline-to-centerline spacing between the slots.

12. The semiconductor device of claim 1, wherein the metal clip comprises Cu or Al.

13. The semiconductor device of claim 1, wherein the semiconductor die comprises Si, SiC, or GaN.

14. The semiconductor device of claim 1, wherein the semiconductor die includes a lateral power device, and wherein all power and signal connections to the semiconductor die are made at the side of the semiconductor die facing away from the substrate.

15. The semiconductor device of claim 1, wherein the semiconductor die includes a vertical power device, wherein a first power connection to the semiconductor die is made at a side of the semiconductor die attached to the substrate, and wherein a second power connection and a gate connection to the semiconductor die are made at the side of the semiconductor die facing away from the substrate.

16. The semiconductor device of claim 1, wherein the substrate is a circuit board, a lead frame, a DCB (direct copper bonded) substrate, an AMB (active metal brazed) substrate, or an IMS (insulated metal substrate).

17. The semiconductor device of claim 1, wherein the dimensions and number of slots formed in the metal clip is a function of a flux content of the solder paste that reflowed to form the soldered joint, the volume of the solder paste that reflowed to form the soldered joint, and an area of the metal clip facing the semiconductor die.

18. The semiconductor device of claim 1, wherein the soldered joint between the metal clip and the semiconductor die has a void concentration of 1.1% or less outside the plurality of slots.

19. The semiconductor device of claim 1, wherein the slots have the same dimensions.

20. The semiconductor device of claim 1, wherein at least one of the slots has one or more different dimensions compared to the other slots.

* * * * *